United States Patent
Cho

(10) Patent No.: US 8,350,274 B2
(45) Date of Patent: Jan. 8, 2013

(54) LIGHT EMITTING DEVICE, METHOD OF MANUFACTURING THE LIGHT EMITTING DEVICE, LIGHT EMITTING DEVICE PACKAGE, AND LIGHTING UNIT

(75) Inventor: Hyun Kyong Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 42 days.

(21) Appl. No.: 12/975,498

(22) Filed: Dec. 22, 2010

(65) Prior Publication Data

US 2011/0220941 A1 Sep. 15, 2011

(30) Foreign Application Priority Data

Mar. 10, 2010 (KR) .................. 10-2010-0021401

(51) Int. Cl.
*H01L 27/15* (2006.01)
*H01L 21/00* (2006.01)

(52) U.S. Cl. ............ 257/79; 257/81; 257/E33.002; 257/E33.072; 438/22; 438/24; 349/56; 349/67

(58) Field of Classification Search .......... 438/22, 438/24, 37, 46, 93; 257/79–84, 86, 94, 95, 257/97; 349/56, 61, 62, 67
See application file for complete search history.

(56) References Cited

U.S. PATENT DOCUMENTS

| | | | | |
|---|---|---|---|---|
| 7,956,376 B2* | 6/2011 | Jeong | ............. | 257/98 |
| 8,102,484 B2* | 1/2012 | Lee et al. | ............. | 349/61 |
| 2009/0026478 A1 | 1/2009 | Yoon et al. | | |
| 2009/0066925 A1 | 3/2009 | Ohsaki et al. | | |
| 2011/0089452 A1* | 4/2011 | Jeong et al. | ............. | 257/98 |
| 2011/0095332 A1* | 4/2011 | Hwang et al. | ............. | 257/103 |
| 2011/0133242 A1* | 6/2011 | Choi et al. | ............. | 257/99 |

FOREIGN PATENT DOCUMENTS

| | | | |
|---|---|---|---|
| JP | 2001-144321 A | 5/2001 |
| JP | 2006-040998 A | 2/2006 |
| JP | 2006-135215 A | 5/2006 |
| KR | 2009-0001107 A | 1/2009 |
| KR | 2009-0010569 A | 1/2009 |
| KR | 2009-0027329 A | 3/2009 |

OTHER PUBLICATIONS

F.K. Yam, et al., "Low Applied Bias for p-GaN Electroluminescent Devices," Microlectronic Engineering 81 (2005), pp. 268-272.

* cited by examiner

*Primary Examiner* — Hsien Ming Lee
(74) *Attorney, Agent, or Firm* — McKenna Long & Aldridge LLP

(57) ABSTRACT

Provided are a light emitting device, a method for fabricating the light emitting device, a light emitting device package, and a lighting unit. The light emitting device includes a conductive support substrate, a first reflective layer on the conductive support substrate, a second reflective layer in which at least portion thereof is disposed on a side surface of the first reflective layer, a light emitting structure including a first conductive type semiconductor layer, a second conductive type semiconductor layer, and an active layer between the first conductive type semiconductor layer and the second conductive type semiconductor layer on the first and second reflective layers, and an electrode on the light emitting structure. The second reflective layer schottky-contacts the light emitting structure.

20 Claims, 18 Drawing Sheets

LIGHT EMITTING DEVICE, METHOD OF MANUFACTURING THE LIGHT EMITTING DEVICE, LIGHT EMITTING DEVICE PACKAGE, AND LIGHTING UNIT

CROSS-REFERENCE TO RELATED APPLICATIONS

The present application claims priority of Korean Patent Application No. 10-2010-0021401 filed on Mar. 10, 2010, which is hereby incorporated by reference in its entirety.

BACKGROUND OF THE INVENTION

Embodiments relate to a light emitting device, a method of manufacturing the light emitting device, a light emitting device package, and a lighting unit.

Light emitting diodes (LEDs) are semiconductor light emitting devices that convert current into light. As luminance of LEDs is increased recently, the LEDs are being used as light sources for displays, vehicles, and illuminations. Also, LEDs emitting highly efficient white light may be realized by using a fluorescent substance or combining LEDs having various colors.

To improve bright and performance of LEDs, various methods such as a method of improving a light extraction structure, a method of improving a structure of an active layer, a method of improving current spreading, a method of improving an electrode structure, and a method of improving a structure of a light emitting diode package may be being attempted.

SUMMARY OF THE INVENTION

Embodiments provide a light emitting device having a new structure, a method of manufacturing the light emitting device, a light emitting device package, and a lighting unit.

Embodiments also provide a light emitting device having improved light emitting efficiency, a method of manufacturing the light emitting device, a light emitting device package, and a lighting unit.

In one embodiment, a light emitting device includes: a conductive support substrate; a first reflective layer on the conductive support substrate; a second reflective layer in which at least portion thereof is disposed on a side surface of the first reflective layer; a light emitting structure including a first conductive type semiconductor layer, a second conductive type semiconductor layer, and an active layer between the first conductive type semiconductor layer and the second conductive type semiconductor layer on the first and second reflective layers; and an electrode on the light emitting structure, wherein the second reflective layer contacts the light emitting structure to realize schottky contact, wherein a portion of the second reflective layer is disposed between the first reflective layer and the conductive support substrate.

In another embodiment, a light emitting device includes: a conductive support substrate; a second reflective layer on the conductive support substrate; a first reflective layer on the second reflective layer; a light emitting structure including a first conductive type semiconductor layer, a second conductive type semiconductor layer, and an active layer between the first conductive type semiconductor layer and the second conductive type semiconductor layer on the first and second reflective layers; and an electrode on the light emitting structure, wherein the light emitting structure has an inclined side surface, the first conductive type semiconductor layer has a roughness, a portion of the second reflective layer contacts the light emitting structure, and a first part of the first reflective layer vertically overlaps the roughness, and a second portion of the first reflective layer vertically overlaps the inclined surface of the light emitting structure.

The details of one or more embodiments are set forth in the accompanying drawings and the description below. Other features will be apparent from the description and drawings, and from the claims.

DETAILED DESCRIPTION OF THE ILLUSTRATED EMBODIMENTS

Figure 1:
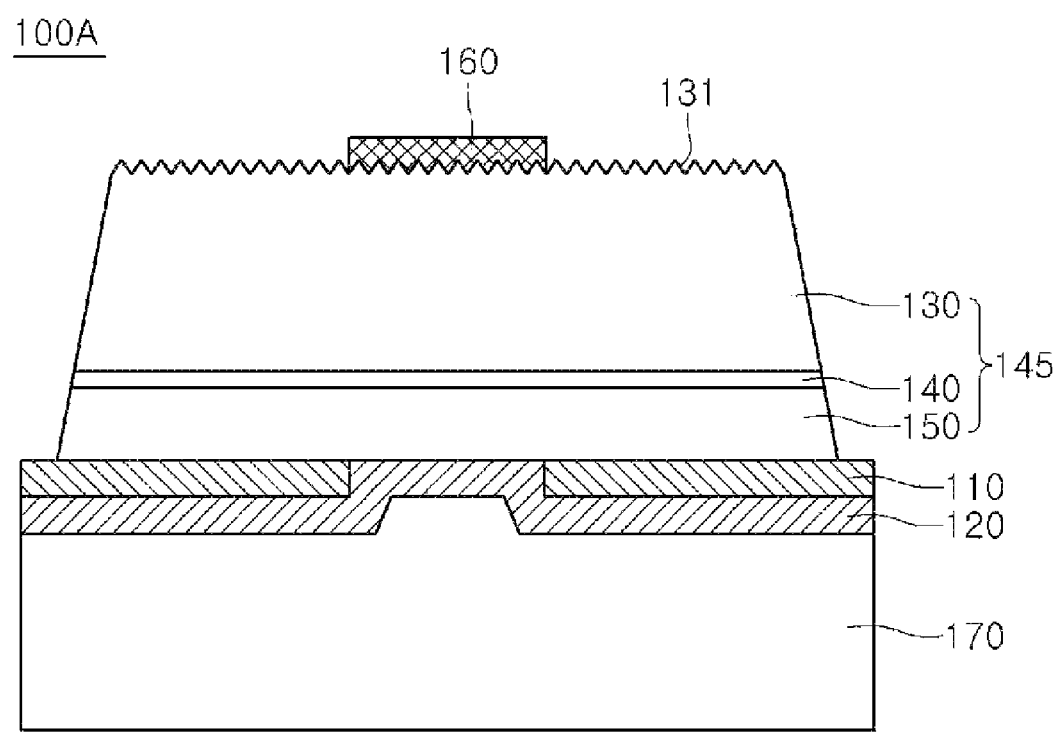
FIG. 1 is a sectional view of a light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a method of manufacturing the light emitting device, a light emitting device package, and a lighting system according to an embodiment will be described with reference to accompanying drawings.

FIG. 1 is a sectional view of a light emitting device 100A according to an embodiment.

Referring to FIG. 1, the light emitting device 100A according to an embodiment may include a conductive support substrate 170, a second reflective layer 120 on the conductive support substrate 170, a first reflective layer 110 on the second reflective layer 120, a light emitting structure 145 on the first and second reflective layers 110 and 120, and an electrode 160 on the light emitting structure 145.

At least portion of the first reflective layer 110 contacts the light emitting structure 145 to realize ohmic contact.

At least portion of the second reflective layer 120 contacts the light emitting structure 145 to realize schottky contact. Here, at least portion of a region in which the schottky contact is realized between the second reflective layer 120 and the light emitting structure 145 may vertically overlap the electrode 160.

Thus, in the light emitting device 100A according to an embodiment, a phenomenon in which a current concentrately flows into the shortest distance between the electrode 160 and the conductive support substrate 170 may be prevented. Thus, the current may be spread into the entire region of the light emitting structure 145.

The first reflective layer 110 may be formed of a metal or alloy containing Ag having high reflectance. The first reflective layer 110 may reflect light incident from the light emitting structure 145 to improve light emitting efficiency.

Also, the second reflective layer 120 may be formed of a metal or alloy containing Ag having high reflectance. The second reflective layer 120 may reflect the light incident from the light emitting structure 145 to improve the light emitting efficiency. The first reflective layer and the second reflective layer may be formed of a same material.

That is, the first reflective layer 110 is partially disposed on the conductive support substrate 170. Also, the first reflective layer 110 contacts the light emitting structure 145. The second reflective layer 120 is partially disposed on the conductive support substrate 170. Also, the second reflective layer 120 contacts the light emitting structure 145. The first reflective layer 110 may be disposed around at least portion of the second reflective layer 120. At least portion of the second reflective layer 120 may flush with the first reflective layer 110.

In the current embodiment, a portion of the second reflective layer 120 is disposed under the first reflective layer 110. That is, a portion of the second reflective layer 120 may be disposed between the first reflective layer 110 and the conductive support substrate 170.

Also, a portion of the second reflective layer 120 is disposed on a side surface of the first reflective layer 110. That is, the second reflective layer 120 may protrude in a direction in which the light emitting structure 145 is disposed.

Although one portion of the second reflective layer 120 contacts the light emitting structure 145 in the current embodiment, a plurality of portions of the second reflective layer 120 may contact the light emitting structure 145.

Hereinafter, each of components of the light emitting device 100A according to an embodiment will be described in detail.

The conductive support substrate 170 supports the light emitting device 100A. Also, the conductive support substrate 170 together with the electrode 160 may provide a power to the light emitting structure 145.

The conductive support substrate 170 may be formed of at least one of Cu, Ni, Mo, Al, Au, Nb, W, Ti, Cr, Ta, Pd, Pt, Si, Ge, GaAs, ZnO, and SiC.

The second reflective layer 120 may be disposed on the conductive support substrate 170.

The second reflective layer 120 may be formed of a material having high reflectance in which light incident from the light emitting structure 145 is effectively reflected and contacting the light emitting structure 145 to realize the schottky contact. The second conductive layer 120 may be formed of a conductive material and contain a metal material. For example, the second reflective layer 120 may be formed of a thermally treated metal or alloy containing Ag.

Generally, the metal or alloy containing Ag may ohmic-contacts a P-type semiconductor layer. However, when the metal or alloy containing Ag is thermally treated at a temperature of about 400° C. to about 450° C., the metal or alloy may be changed in physical property to schottky-contact the P-type semiconductor layer. Thus, the second reflective layer 120 may be formed of the thermally treated metal or alloy containing Ag.

At least portion of the second reflective layer 120 may contact the light emitting structure 145 through a gap between the first reflective layers 110. Thus, when the second reflective layer 120 is formed using a deposition or plating process, a bottom surface of the second reflective layer 120 may protrude upward in a region corresponding to the gap between the first reflective layers 110, but is not limited thereto.

At least portion of a region in which the second reflective layer 120 schottky-contacts the light emitting structure 145 may vertically overlap the electrode 160. Thus, it may prevent a current from concentrately flowing into the shortest between the electrode 160 and the conductive support substrate 170 to spread the current into the entire region of the light emitting structure 145.

An adhesion layer (not shown) for improving an adhesion of an interface between the second reflective layer 120 and the conductive support substrate 170 may be further disposed between the second reflective layer 120 and the conductive support substrate 170. For example, the adhesion layer may include a layer containing one or more of Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2O, Cu—Zn, Cu—P, Ni—P, Ni—Mn—Pd, Ni—P, and Pd—Ni.

The first reflective layer 110 may be disposed around a circumference region of a top surface of the second reflective layer 120. The first reflective layer 110 may be formed of a conductive material. Also, the first reflective layer 110 may contain a metal.

The first reflective layer 110 may be formed of a material in which light emitted from the light emitting structure 145 is effectively reflected, e.g., at least one of Ag, Al, Pd, and Pt.

For example, the first reflective layer 110 may be formed of a thermally treated metal or alloy containing Ag.

Generally, when the metal or alloy containing Ag is thermally treated at a temperature of about 400° C. to about 450° C., the metal or alloy may be changed in physical property to schottky-contact the P-type semiconductor layer. Thus, the first reflective layer 110 may be formed of the thermally treated metal or alloy containing Ag.

The first and second reflective layers 110 and 120 may ohmic-contact or schottky-contact the P-type semiconductor according to a thermal treatment temperature. The thermal treatment temperature may be changed according to a thin film characteristic of the P-type semiconductor layer.

The first reflective layer 110 may ohmic-contact the light emitting structure 145. When the first reflective layer 110 does not ohmic-contact the light emitting structure 145, a separate ohmic contact layer (not shown) may be further disposed between the first reflective layer 110 and the light emitting structure 145. The ohmic contact layer may have a single- or multi-layered structure. For example, the contact layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The light emitting structure 145 may be disposed on the first and second reflective layers 110 and 120.

Here, at least portion of a second conductive type semiconductor layer 150 of the light emitting structure 145 contacts the first reflective layer 110 to realize ohmic contact. Also, at least portion of the second conductive type semiconductor layer 150 contacts the second reflective layer 120 to realize schottky contact. Specifically, when the schottky contact portion vertically overlaps the electrode 160, light emitting efficiency of the light emitting structure 145 may be improved by a current spreading effect.

For example, the light emitting structure 145 may include a first conductive type semiconductor layer 130, an active layer 140 under the first conductive type semiconductor layer 130, and the second conductive type semiconductor layer 150 under the active layer 140. The light emitting structure 145 may have an inclined side surface.

The first conductive type semiconductor layer 130 may include only a semiconductor layer containing first conductive type impurities or may further include an undoped semiconductor layer on the semiconductor layer containing the first conductive type impurities, but is not limited thereto.

For example, the first conductive type semiconductor layer 130 may be realized as an N-type semiconductor layer. The N-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. The N-type semiconductor layer may be doped with an N-type dopant such as Si, Ge, or Sn.

Since a conductive type dopant is not doped into the undoped semiconductor layer is a layer, the undoped semiconductor layer is a layer having significantly low conductivity than the first and second conductive type semiconductor layers 130 and 150. Also, the undoped semiconductor layer is a layer, which is grown to improve crystalline of the first conductive type semiconductor layer 130.

The active layer 140 may be disposed under the first conductive type semiconductor layer 130. The active layer 140 is a layer in which electrons (or holes) injected through the first conductive type semiconductor layer 130 meets with electrons (holes) injected through the second conductive type semiconductor layer 150 to emit light by a band gap difference of an energy band depending on a formation material of the active layer 140.

The active layer 140 may have a single quantum well structure, a multi quantum well (MQW) structure, a quantum dot structure, or a quantum wire structure, but is not limited thereto.

The active layer 140 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 140 has the MQW structure, a plurality of well layers and a plurality of barrier layers may be stacked to form the active layer 140. For example, the active layer 140 may have a cycle of InGaN well layer/GaN barrier layer. Each of the plurality of well layers has an energy band gap less than that of each of the plurality of barrier layers.

A clad layer (not shown) in which an N-type or P-type dopant is doped may be disposed on/under the active layer 140. The clad layer (not shown) may be realized as an AlGaN layer or an InAlGaN layer.

For example, the second conductive semiconductor layer 150 may be realized as a P-type semiconductor layer. The P-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN. Also, the P-type semiconductor layer may be doped with a P-type dopant such as Mg, Zn, Ca, Sr, or Ba.

Unlike foregoing descriptions, the first conductive type semiconductor layer 130 may include the P-type semiconductor layer, and the second conductive type semiconductor layer 150 may include the N-type semiconductor layer. Also, a third conductive type semiconductor layer (not shown) including an N-type or P-type semiconductor layer may be disposed on the first conductive type semiconductor layer 130. Thus, the light emitting device 100 may have at least one of an np junction structure, a pn junction structure, an npn junction structure, and a pnp junction structure. Also, the conductive type dopant may be uniformly or non-uniformly distributed within the first conductive type semiconductor layer 130 and the second conductive type semiconductor layer 150. That is, the light emitting structure layer 50 may have various structures, but is not limited thereto.

Also, a roughness 131 for improving light extraction efficiency may be disposed on a top surface of the light emitting structure 145.

A first portion of the first reflective layer 110 may vertically overlap the roughness 131, and a second portion of the first reflective layer 110 may vertically overlap the inclined side surface of the light emitting structure 145. Also, a third part of the first reflective layer 110 may do not vertically overlap the light emitting structure 145.

The electrode 160 may be disposed on the light emitting structure 145. The electrode 160 together with the conductive support substrate 170 may supply a power to the light emitting structure 145. For example, the electrode 160 may be formed of at least one of Al, Ti, Cr, Ni, Cu, and Au. Also, the electrode 160 may have a multi-layered structure including a plurality of layers formed of materials different from each other.

Hereinafter, a method of manufacturing the light emitting device 100A according to an embodiment will be described in detail. The explanations duplicated with the aforementioned embodiment will be omitted.

FIGS. 2 to 7 are views illustrating a process for fabricating the light emitting device 100A according to an embodiment.

Figure 2:
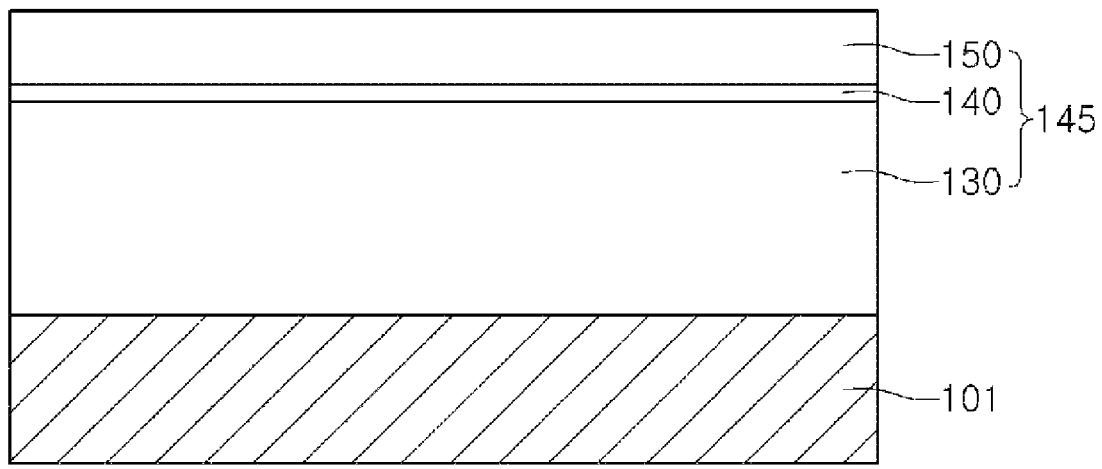
FIGS. 2 to 7 are views illustrating a process of manufacturing the light emitting device according to an embodiment.

Referring to FIG. 2, a light emitting structure 145 may be formed on a growth substrate 101.

For example, the growth substrate 101 may be formed of at least one of sapphire ($Al_2O_3$), SiC, GaAs, GaN, ZnO, Si, GaP, InP, Ge, and SiGe, but is not limited thereto.

A first conductive type semiconductor layer 130, an active layer 140, and a second conductive type semiconductor layer 150 may be sequentially grown on the growth substrate 101 to form the light emitting structure 145.

For example, the light emitting structure layer 145 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

Figure 3:
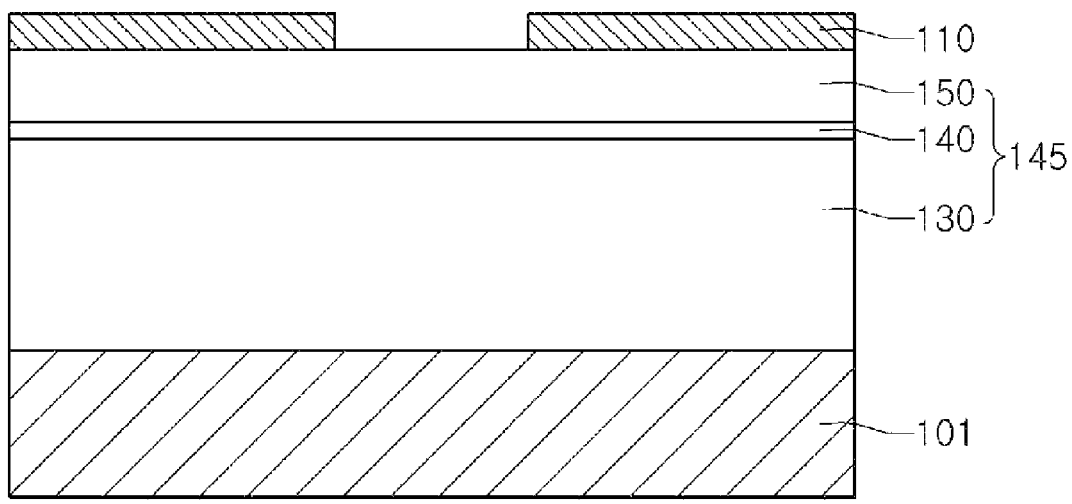

Referring to FIG. 3, a first reflective layer 110 may be formed on a circumference region of a top surface of the light emitting structure 145. That is, the first reflective layer 110 may be formed to expose at least portion of the top surface of the light emitting structure 145.

The first reflective layer 110 may be formed using a deposition or plating process, but is not limited thereto.

For example, the first reflective layer may be formed a metal or alloy containing at least one of Ag, Al, Pd, and Pt.

For example, the first reflective layer 110 may be formed of a metal or alloy containing Ag, which is thermally treated at a temperature of about 450° C. to about 550.

Figure 4:
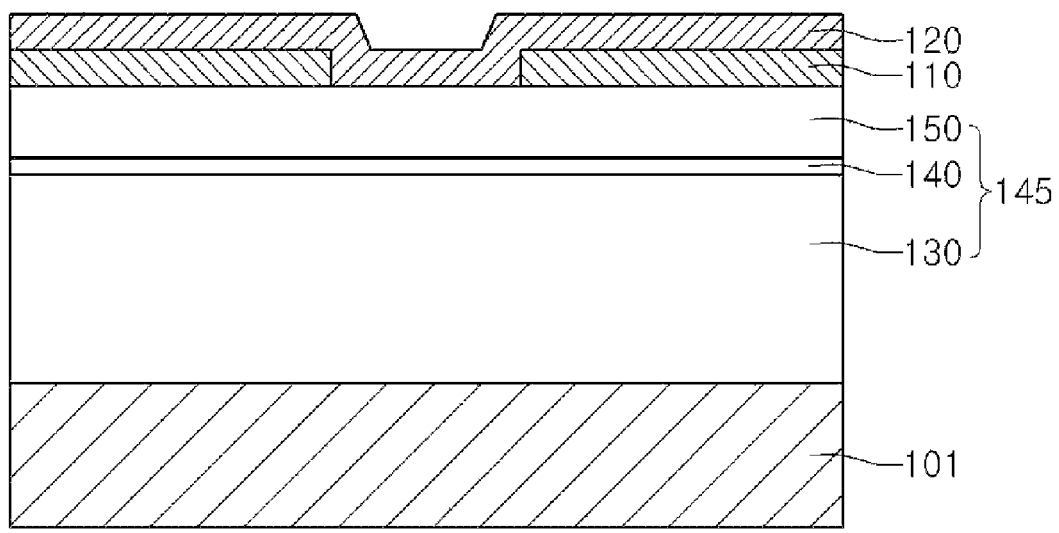

Referring to FIG. 4, a second reflective layer 120 may be formed on the light emitting structure 145 and the first reflective layer 110.

The first reflective layer 110 may be disposed around at least portion of the second reflective layer 120. At least portion of the second reflective layer 120 may flush with the first reflective layer 110.

The second reflective layer 120 may contact the light emitting structure 145 through a gap between the first reflective layers 110 to realize schottky-contact. At least portion of the schottky-contact region may vertically overlap an electrode (that will be formed alter). Thus, the second reflective layer 120 may spread a current into the light emitting structure 145.

Also, the second reflective layer 120 may be formed of a material in which light emitted from the light emitting structure 145 is effectively reflected. For example, the second reflective layer 120 may be formed of a thermally treated metal or alloy containing Ag, but is not limited thereto.

The second reflective 120 may be formed using a deposition or plating process, but is not limited thereto.

For example, the second reflective layer 120 may be formed of a metal or alloy containing Ag, which is thermally treated at a temperature of about 400° C. to about 450° C.

A region formed between the first reflective layers 110 in a region of the second reflective layer 120 may protrude upward. Also, the second reflective layer 120 may be not formed on the entire region of the first reflective layer 110, but may be formed on only a portion of the first reflective layer 110, but is not limited thereto.

Figure 5:
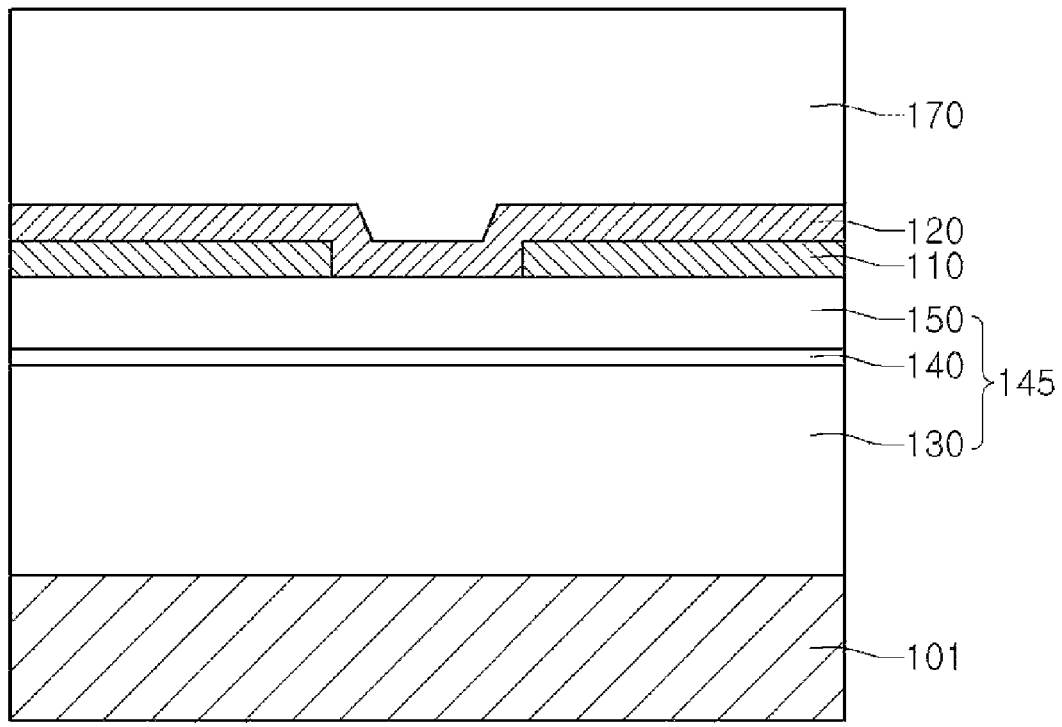

Referring to FIG. 5, a conductive support substrate 170 may be formed on the second reflective layer 120.

The conductive support substrate 170 may be formed using a plating or deposition process. Alternatively, a separate sheet may be prepared and bonded to form the conductive support substrate 170. When the separate sheet is prepared and bonded, an adhesion layer (not shown) for reinforcing an adhesion of an interface between the conductive support substrate 170 and the second reflective layer 120 may be further formed between the conductive support substrate 170 and the second reflective layer 120.

Figure 6:
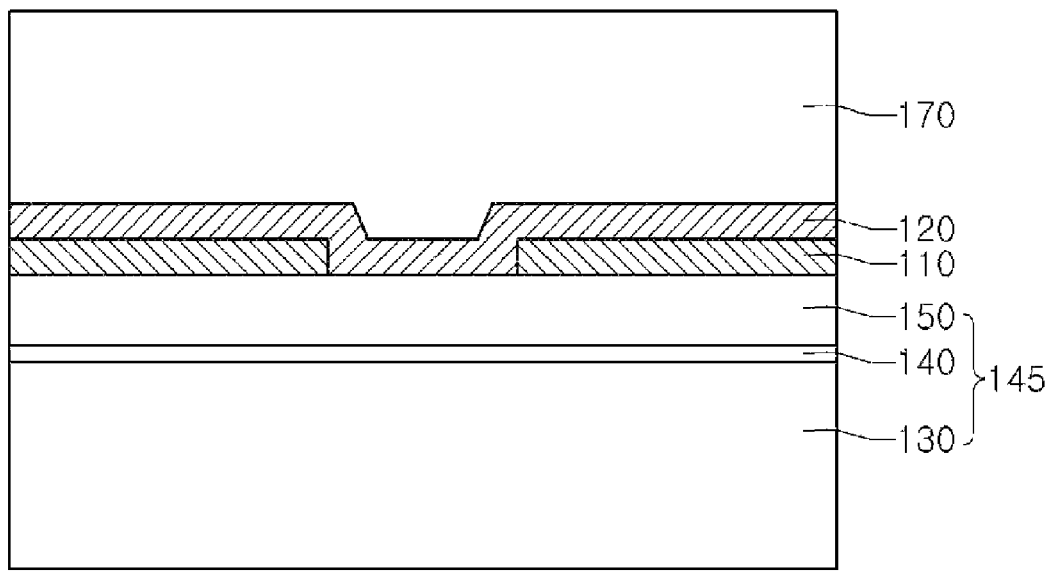

Referring to FIGS. 5 and 6, the growth substrate 101 is removed.

The growth substrate 101 may be removed using at least one of a laser lift off (LLO) process and an etch process, but is not limited thereto.

As the growth substrate 101 is removed, a bottom surface of the first conductive type semiconductor layer 130 of the light emitting structure 145 is exposed.

Figure 7:
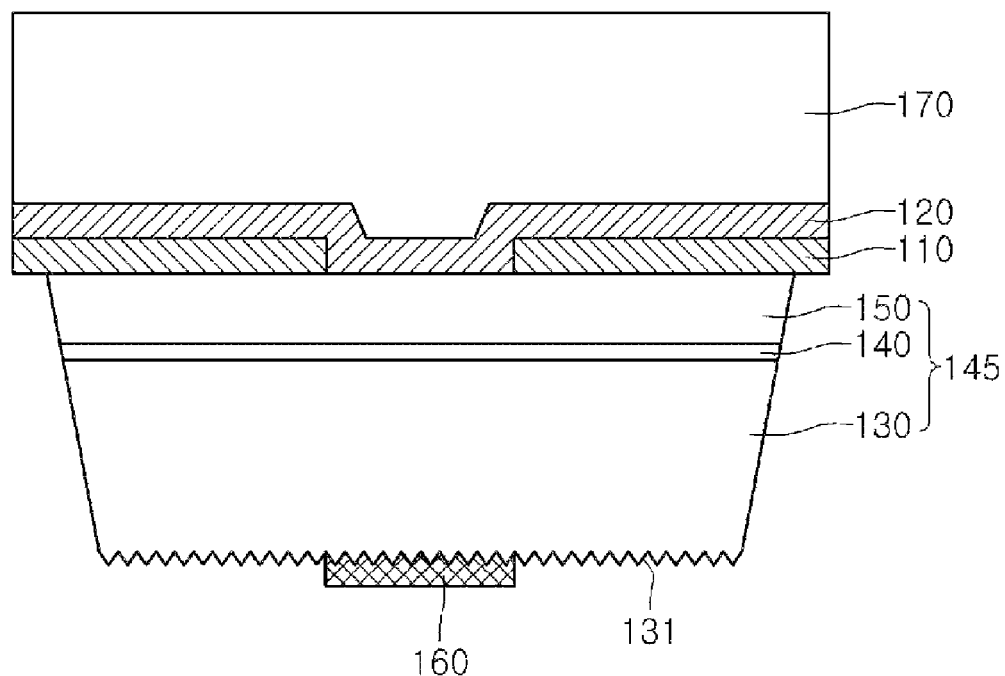

Referring to FIG. 7, an isolation etching process through which a plurality of light emitting devices is divided into individual device units may be performed on the exposed light emitting structure 145. Also, a roughness 131 for improve light extraction efficiency may be formed on the bottom surface of the light emitting structure 145.

Here, the light emitting structure 145 may have an inclined side surface. A portion of the first reflective layer 110 may be exposed to a side of the light emitting structure 145, and a region in which the first reflective layer 110 does not vertically overlap the light emitting structure 145 may be generated. Thus, the light emitting device 100A according to an embodiment may be manufactured.

Hereinafter, a method of manufacturing the light emitting device 100B according to another embodiment will be described in detail. In descriptions of another embodiment, explanations duplicated with the aforementioned embodiment will be omitted.

Figure 8:
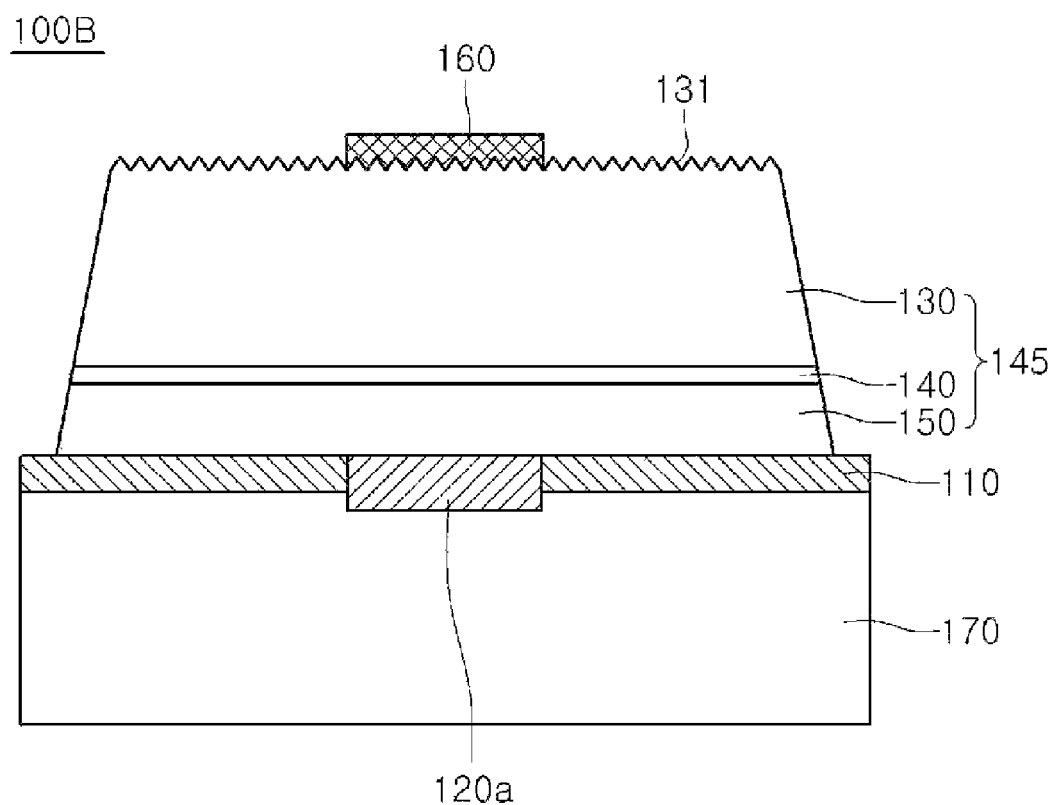
FIG. 8 is a sectional view of a light emitting device according to another embodiment.

FIG. 8 is a sectional view of the light emitting device 100B according to another embodiment. The light emitting device 100B according to another embodiment is equal to the light emitting device 100A according to an embodiment except a shape of a second reflective layer.

Referring to FIG. 8, the light emitting device 100B according to another embodiment may include a conductive support substrate 170, a first reflective layer 110 on the conductive support substrate 170, a second reflective layer 120a within the first reflective layer 110, a light emitting structure 145 on the first and second reflective layers 110 and 120a, and an electrode 160 on the light emitting structure 145.

The first reflective layer 110 may be partially disposed on the conductive support substrate 170. The first reflective layer 110 may be disposed around the second reflective layer 120a. Alternatively, the second reflective layer 120a may be flush with the first reflective layer 110.

Although the second reflective layer 120a is disposed at a central portion of the conductive support substrate 170 in another embodiment, the second reflective layer 120a may be disposed on a plurality of portions of the conductive support substrate 170. Although the second reflective layer 120 is disposed under the first reflective layer 110 in the foregoing embodiment, the second reflective layer 120a may be disposed on a side surface of the first reflective layer 110, but is not disposed under the first reflective layer 110.

The second reflective layer 120a may contact the light emitting structure 145 to realize schottky contact. At least portion of the schottky contact region may vertically overlap the electrode 160 to improve current spreading within the light emitting structure 145. Also, the second reflective layer 120a may be formed of a material having high reflectance to improve light emitting efficiency of the light emitting device 100B.

Here, the second reflective layer 120a may have a thickness different from that of the first reflective layer 110. That is, as shown in FIG. 8, the second reflective layer 120a may have a thickness greater or less than that of the first reflective layer 110. Thus, the second reflective layer 120a and the first reflective layer 110 may have a height difference therebetween.

A difference of the thicknesses may occur in a process of manufacturing the second reflective layer 120a. That is, since the first and second reflective layers 110 and 120a are manufactured using separate deposition or plating processes, the difference of the thicknesses of the first and second reflective layers 110 and 120a may occur. Alternatively, the first and second reflective layers 110 and 120a may have the same thickness as each other.

Hereinafter, a method of manufacturing the light emitting device 100B according to another embodiment will be described.

FIGS. 9 to 15 are views illustrating a process of manufacturing the light emitting device 100B according to another embodiment.

Figure 9:
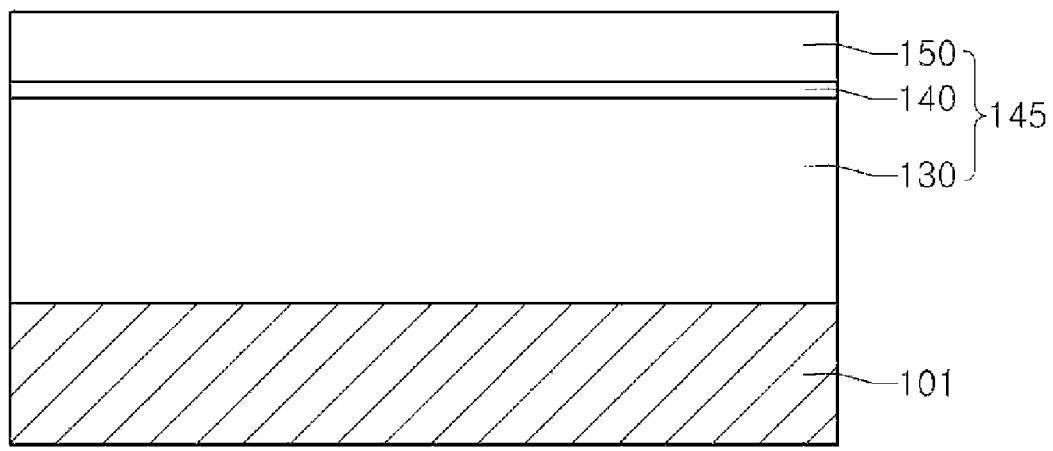
FIGS. 9 to 15 are views illustrating a process of manufacturing the light emitting device according to another embodiment.

Referring to FIG. 9, a light emitting structure 145 may be formed on a growth substrate 101.

Figure 10:
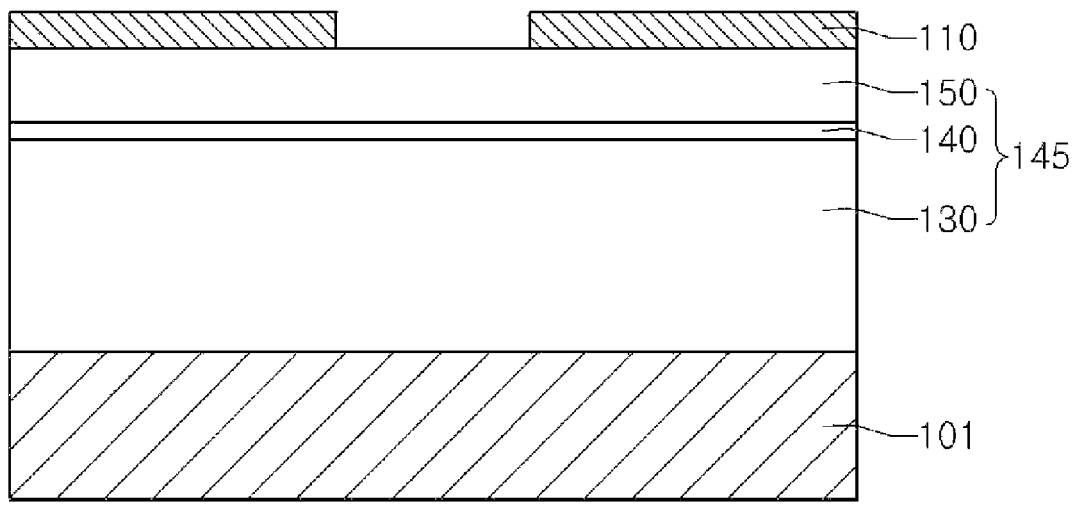

Referring to FIG. 10, a first reflective layer 110 may be formed on a circumference region of a top surface of the light emitting structure 145.

Figure 11:
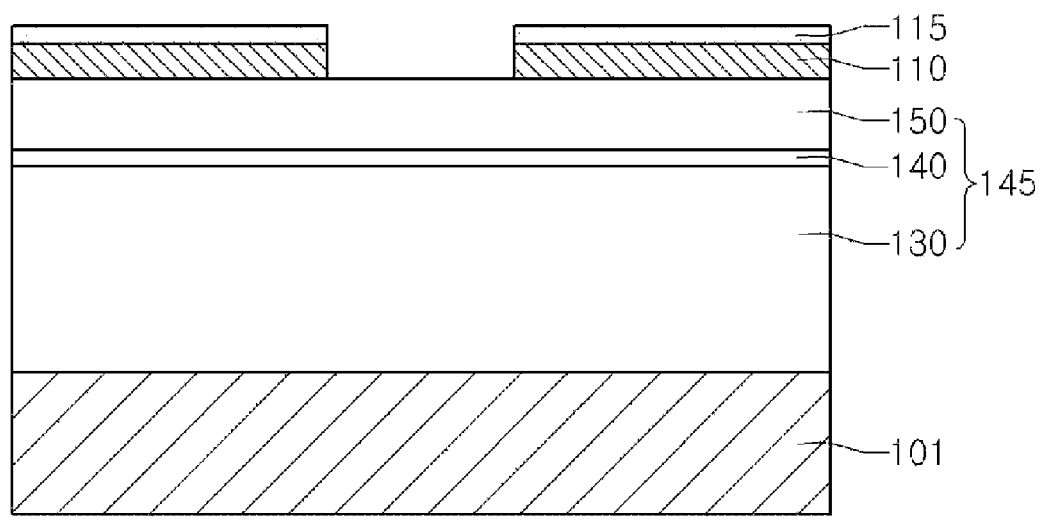

Referring to FIG. 11, a mask layer 115 may be formed on the first reflective layer 110.

The mask layer 115 may be formed correspond to a second reflective layer 120a in a successive process. For example, the mask layer 115 may be formed as a photoresist. Also, the mask layer 115 may be formed using a photolithography process, but is not limited thereto.

Figure 12:
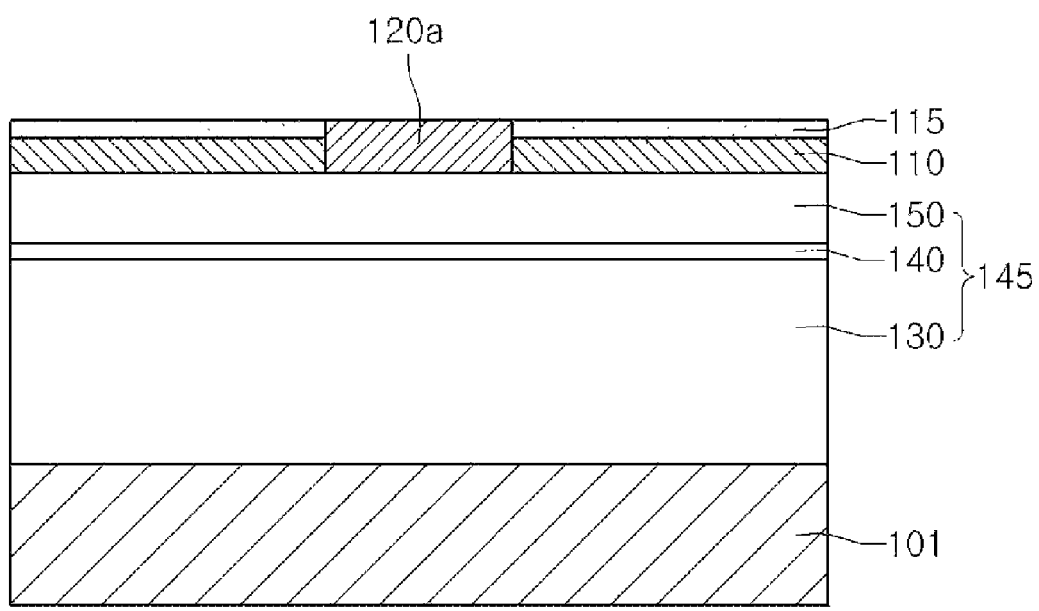

Referring to FIG. 12, a deposition or plating process may be performed using the mask layer 115 as a mask to form the second reflective layer 120*a*.

Since the second reflective layer 120 is formed using the mask layer 115 as a mask, the second reflective layer 120*a* may have a thickness different from that of the first reflective layer 110.

Figure 13:
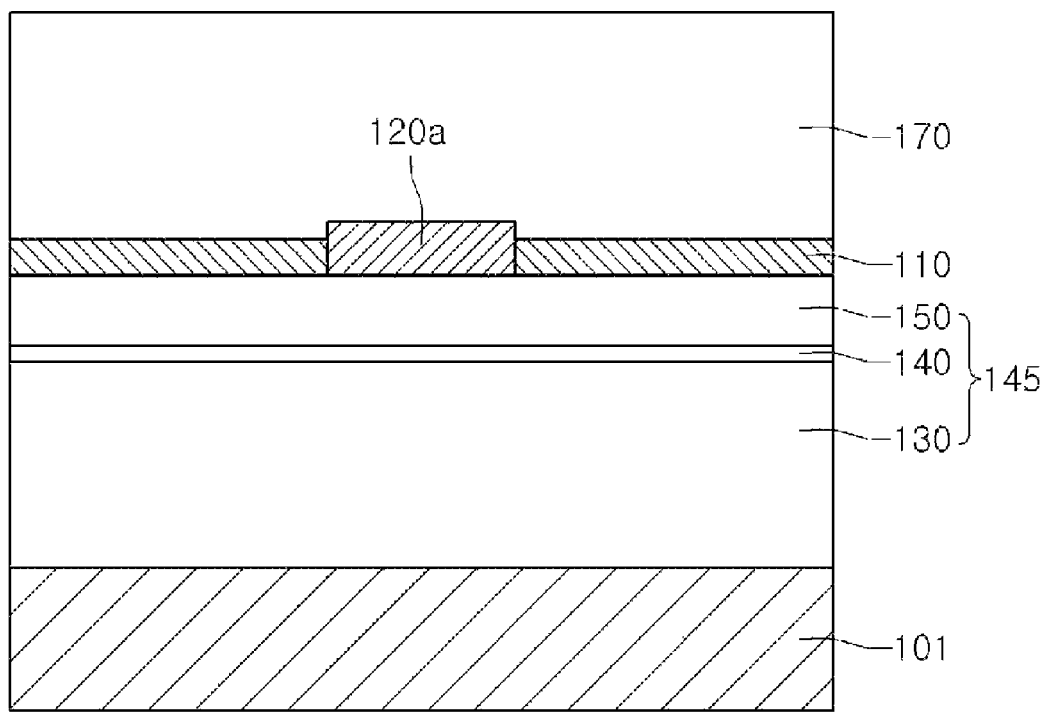

Referring to FIG. 13, a conductive support substrate 170 may be formed on the first and second reflective layers 110 and 120*a*.

Figure 14:
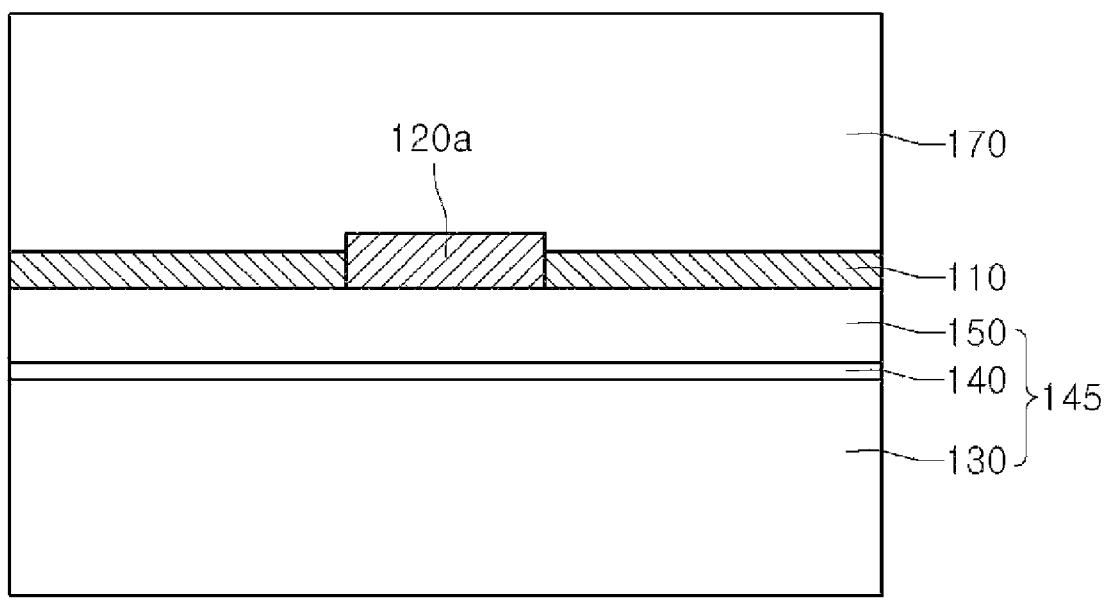

Referring to FIGS. 13 and 14, the growth substrate 101 may be removed.

Figure 15:
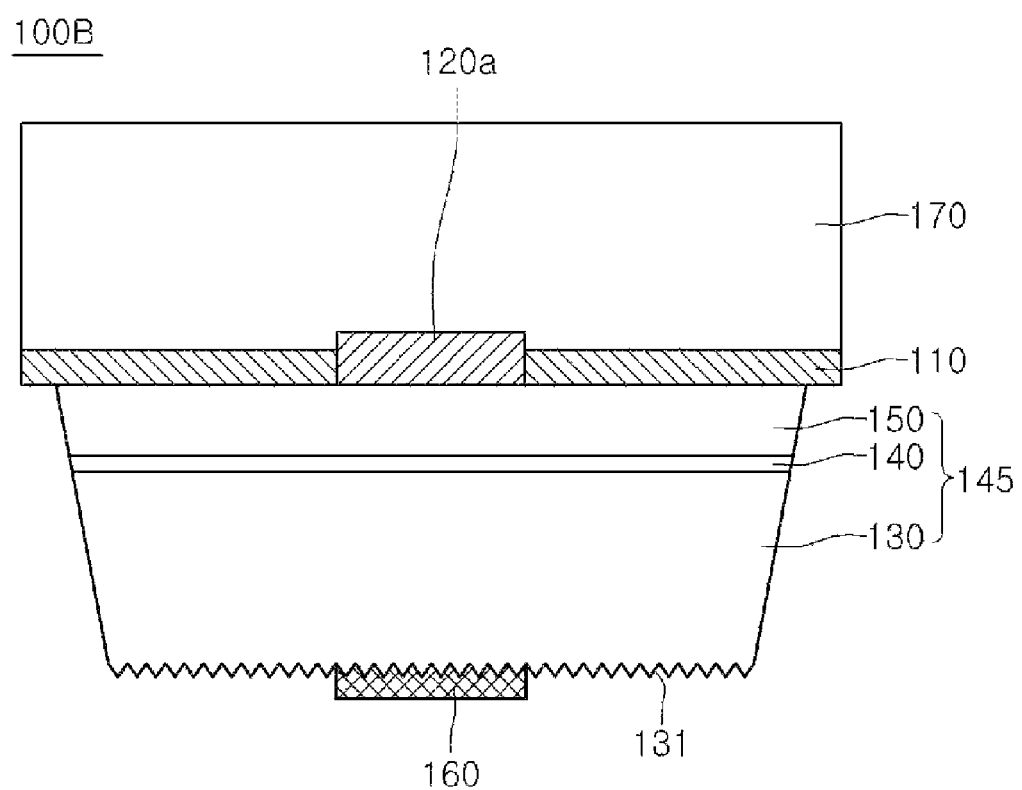

Referring to FIG. 15, an isolation etching process may be performed on the light emitting structure 145 and a roughness may be formed on a bottom surface of the light emitting structure 145 to provide the light emitting device 100B according to another embodiment.

Figure 16:
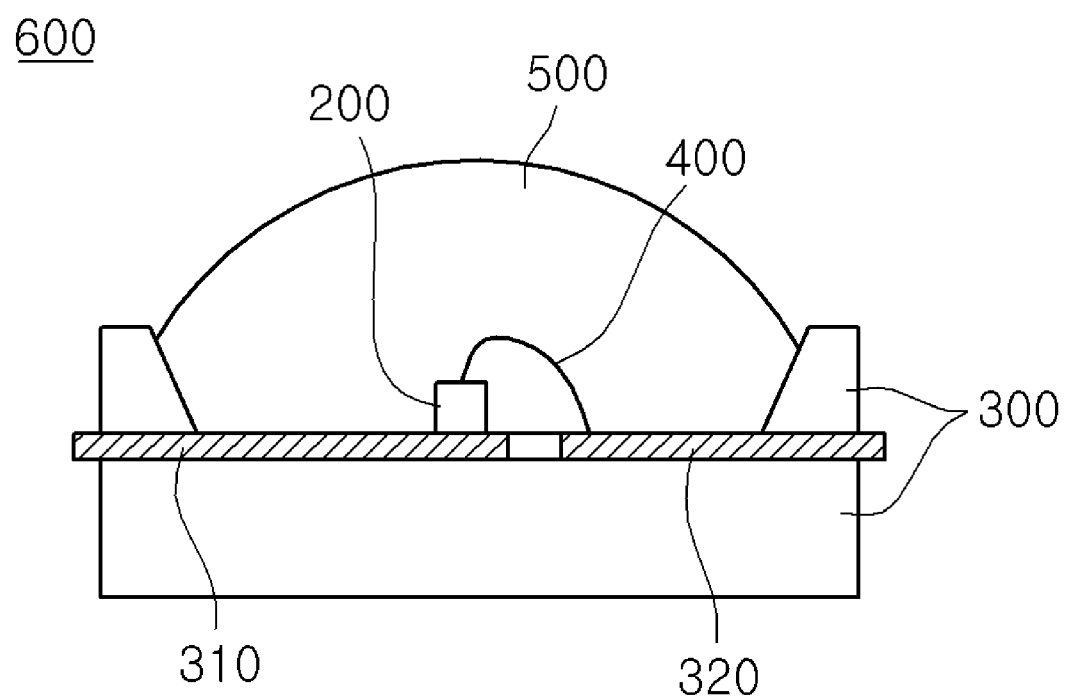
FIG. 16 is a sectional view of a light emitting device package including the light emitting device according to the embodiments.

FIG. 16 is a sectional view of a light emitting device package including the light emitting device according to the embodiments.

Referring to FIG. 16, a light emitting device package 600 according to an embodiment includes a package body 300, first and second electrodes 310 and 320 disposed on the package body 300, a light emitting device 200 disposed on the package body 300 and electrically connected to the first and second electrodes 310 and 320, and a molding member 500 surrounding the light emitting device 200 on the package body 300.

The package body 300 may be formed of a silicon material, a synthetic resin material, or a metal material. An inclined surface may be disposed around the light emitting device 200.

The first electrode 310 and the second electrode 320 may be electrically separated from each other and provide a power to the light emitting device 200. Also, the first and second electrodes 310 and 320 may reflect light generated in the light emitting device 200 to improve light efficiency. In addition, the first and second electrodes 310 and 320 may discharge heat generated in the light emitting device 200 to the outside.

The light emitting device 200 may be disposed on the package body 300 or the first or second electrode 310 or 320.

The light emitting device 200 may be electrically connected to the second electrode 320 through a wire 400.

The molding member 500 may surround the light emitting device 200 to protect the light emitting device 200. Also, a phosphor may be contained in the molding member 500 to change a wavelength of light emitted from the light emitting device 200.

Since the light emitting device 200 having improved light emitting efficiency may be applied, the light emitting device package 600 according to an embodiment may have superior light efficiency.

A plurality of light emitting device packages 600 according to the embodiments may be arrayed on a substrate. Optical members such as a light guide plate, a prism sheet, a diffusion sheet, and a fluorescence sheet may be disposed on a path of light emitted from the light emitting device package 500. The light emitting device package, the substrate and the optical members may function as a backlight unit or lighting unit. For example, the lighting system may include a backlight unit, a lighting unit, an indicator unit, a lamp, a streetlamp, etc.

Figure 17:
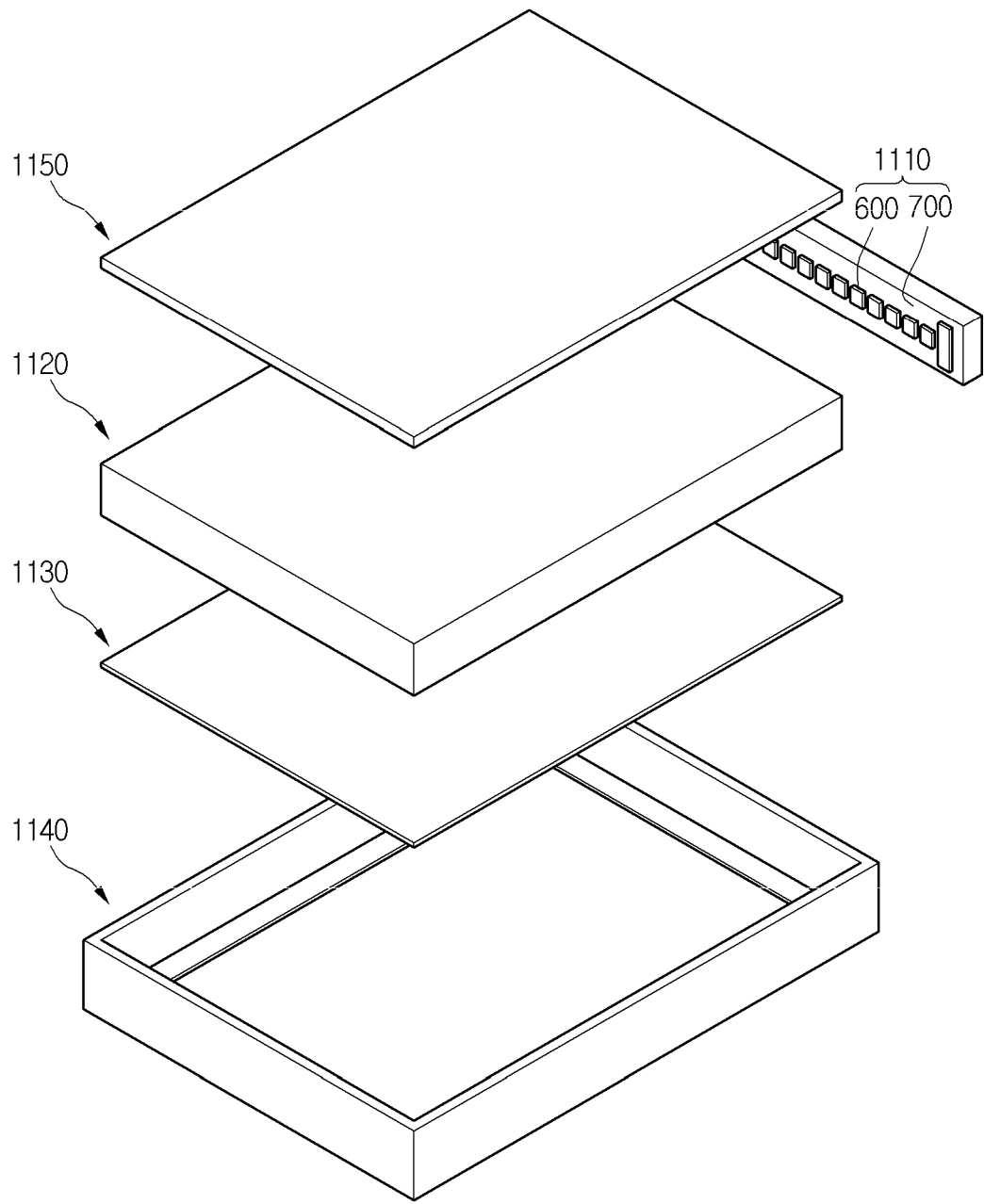
FIG. 17 is a view of a backlight unit including the light emitting device or the light emitting device package according to the embodiments.

FIG. 17 is a view of a backlight unit including the light emitting device or the light emitting device package according to the embodiments. The backlight unit of FIG. 17 is an example of a lighting unit, but is not limited thereto.

Referring to FIG. 17, the backlight unit 1100 may include a bottom frame 1400, a light guide member 1120 disposed within the bottom frame 1140, and a light emitting module 1110 disposed on at least one surface or an under surface of the light guide member 1120. Also, a reflective sheet 1130 may be disposed under the light guide member 1120.

The bottom frame 1140 may have an upwardly opened box shape to receive the light guide member 1120, the light emitting module 1110, and the reflective sheet 1130. Also, the bottom frame 1140 may be formed of a metal material or a resin material, but is not limited thereto.

The light emitting module 1110 may include a substrate 700 and a plurality of light emitting device packages 600 mounted on the substrate. The plurality of light emitting device packages 600 may provide light to the light guide member 1120. In the light emitting module 1110 according to an embodiment, although the light emitting device package 600 is disposed on the substrate 700, the light emitting device 200 according to an embodiment may be directly disposed.

As shown in FIG. 17, the light emitting module 1110 may be disposed on at least one surface of inner side surfaces of the bottom frame 1140, and thus, the light emitting module 1110 may provide light toward at least one side surface of the light guide member 1120.

Alternatively, the light emitting module 1110 may be disposed on an under surface of the bottom frame 1140 to provide light toward an under surface of the light guide member 1120. This may be variously varied according to a design of the BLU, but is not limited thereto.

The light guide member 1120 may be disposed inside the bottom frame 1140. The light guide member 1120 may receive the light provided from the light emitting module 1110 to produce planar light, and then guide the planar light to a liquid crystal panel (not shown).

For example, the light guide member 1120 may be a light guide panel (LGP). The light guide plate may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed on the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. Also, the fluorescence sheet may be a light-transmitting plate or film containing a phosphor.

The reflective sheet 1130 may be disposed under the light guide member 1120. The reflective sheet 1130 may reflects the light emitted through the under surface of the light guide member 1120 toward a light emitting surface of the light guide member 1120.

The reflective sheet 1130 may be formed of a material having superior reflectance, e.g., a PET resin, a PC resin, or a PVC resin, but is not limited thereto.

Figure 18:
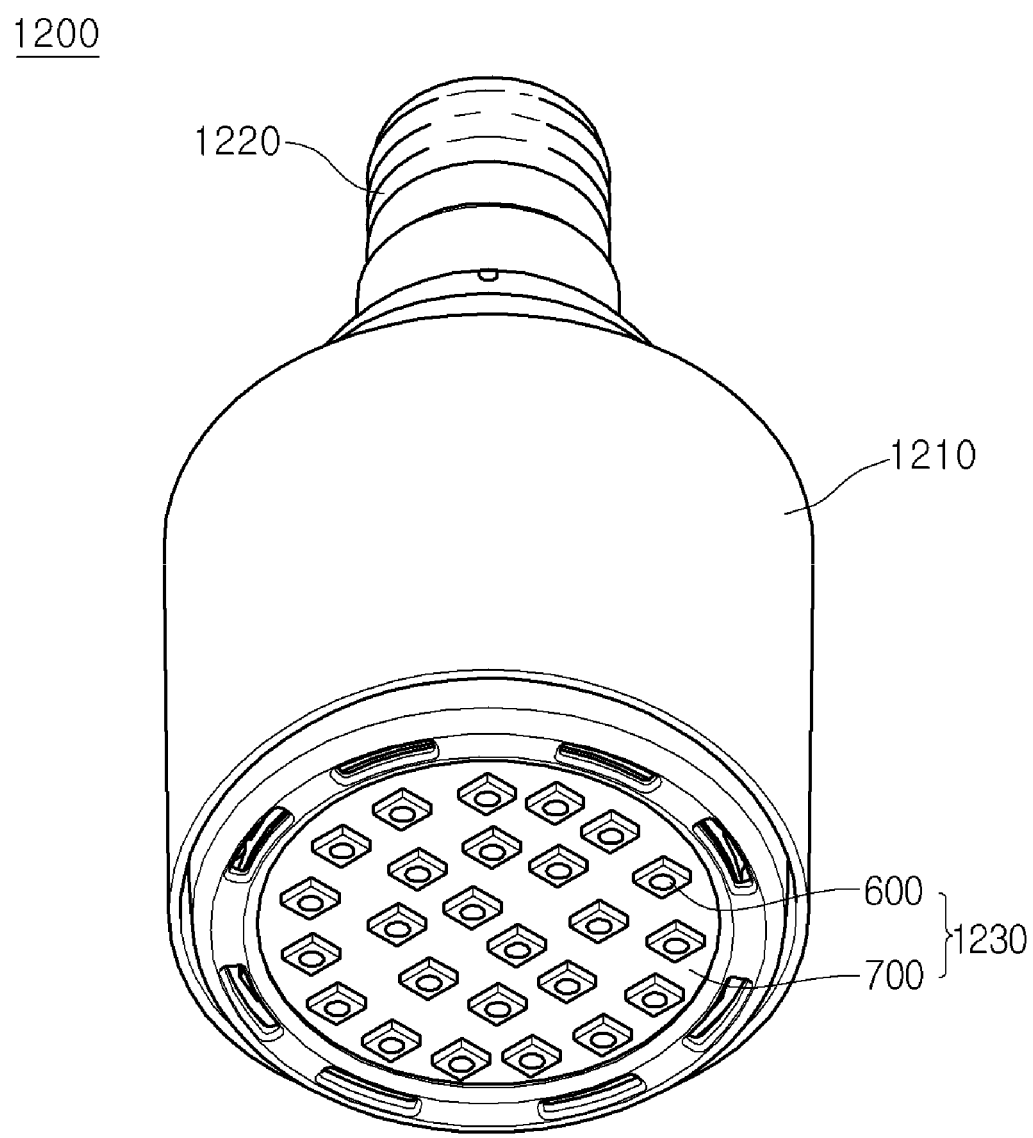
FIG. 18 is a view of a lighting unit including the light emitting device or the light emitting device package according to the embodiments.

FIG. 18 is a view of a lighting unit including the light emitting device or the light emitting device package according to the embodiments. However, a lighting unit 1200 of FIG. 18 is an example of the lighting system, but is not limited thereto.

Referring to FIG. 18, the lighting unit 1200 may include a case body 1210, a light emitting module 1230 disposed on the case body 1210, a connection terminal 1220 disposed on the case body 1210 to receive a power from an external power source.

The case body 1210 may be formed of a material having good thermal dissipation properties, e.g., a metal material or a resin material.

The light emitting module 1230 may include a substrate 700 and at least one light emitting device package 600 mounted on the substrate 700. In the light emitting module 1110 according to an embodiment, although the light emitting device package 600 is disposed on the substrate 700, the light emitting device 200 according to an embodiment may be directly disposed.

A circuit pattern may be printed on a dielectric to form the substrate 700. For example, the substrate 700 may include a printed circuit board (PCB), a metal core PCB, a flexible PCB, and a ceramic PCB.

Also, the substrate 700 may be formed of an effectively reflective material or have a color on which light is effectively reflected from a surface thereof, e.g., a white color or a silver color.

At least one light emitting device package 600 may be mounted on the substrate 700. The light emitting device package 600 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 18, the connected terminal 1120 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting unit, at least one of a light guide member, a diffusion sheet, a light collection sheet, a brightness enhancement sheet, and a fluorescence sheet may be disposed on a path of light emitted from the light emitting module to obtain desired optical effects.

As described above, the lighting system may have superior optical characteristics because it includes the light emitting device or the light emitting device package according to the embodiments.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support substrate;
a first reflective layer on the conductive support substrate;
a second reflective layer in which at least a portion thereof is disposed on a side surface of the first reflective layer;
a light emitting structure comprising a first conductive type semiconductor layer, a second conductive type semiconductor layer, and an active layer between the first conductive type semiconductor layer and the second conductive type semiconductor layer on the first and the second reflective layers; and
an electrode on the light emitting structure,
wherein the second reflective layer schottky-contacts the light emitting structure,
wherein a portion of the second reflective layer is disposed between the first reflective layer and the conductive support substrate.

2. The light emitting device of claim 1, wherein the first reflective layer and the second reflective layer are formed of a same material.

3. The light emitting device of claim 1, wherein the second reflective layer is formed of a metal or alloy containing Ag, which is thermally treated at a temperature of 400° C. to 450° C.

4. The light emitting device of claim 1, wherein the first reflective layer is formed of a metal or alloy containing Ag, which is thermally treated at a temperature of 450° C. to 550° C.

5. The light emitting device of claim 1, wherein the first reflective layer has a thickness different from that of the second reflective layer.

6. The light emitting device of claim 1, wherein bottom surfaces of the first reflective layer and the second reflective layer, respectively, have a height difference therebetween.

7. The light emitting device of claim 6, wherein a region of the second reflective layer contacting the light emitting structure protrudes in a direction in which the light emitting structure is disposed.

8. The light emitting device of claim 1, wherein at least a portion of a region in which the second reflective layer schottky-contacts the light emitting structure vertically overlaps the electrode.

9. The light emitting device of claim 1, wherein the first reflective layer ohmic-contacts the light emitting structure.

10. The light emitting device of claim 1, further comprising an ohmic contact layer between the first reflective layer and the light emitting structure.

11. The light emitting device of claim 1, wherein the first reflective layer is formed of a metal or alloy containing at least one selected from the group consisting of Ag, Al, Pd, and Pt.

12. A light emitting device comprising:
a conductive support substrate;
a second reflective layer on the conductive support substrate;
a first reflective layer on the second reflective layer;
a light emitting structure comprising a first conductive type semiconductor layer, a second conductive type semiconductor layer, and an active layer between the first conductive type semiconductor layer and the second conductive type semiconductor layer on the first and the second reflective layers; and
an electrode on the light emitting structure,
wherein the light emitting structure has an inclined side surface,
the first conductive type semiconductor layer has a roughness,
a portion of the second reflective layer contacts the light emitting structure, and
a first part of the first reflective layer vertically overlaps the roughness, and a second portion of the first reflective layer vertically overlaps the inclined surface of the light emitting structure.

13. The light emitting device of claim 12, wherein a third part of the first reflective layer does not vertically overlap the light emitting structure.

14. The light emitting device of claim 12, wherein the first reflective layer is formed of a conductive material.

15. The light emitting device of claim 12, wherein a portion of the second reflective layer is disposed between the first reflective layer and the conductive support substrate.

16. The light emitting device of claim 12, wherein the second reflective layer is formed of a metal or alloy containing Ag, which is thermally treated at a temperature of 400° C. to 450° C.

17. The light emitting device of claim 12, wherein the first reflective layer is formed of a metal or alloy containing Ag, which is thermally treated at a temperature of 450° C. to 550° C.

18. The light emitting device of claim 12, wherein at least a portion of a region in which the second reflective layer schottky-contacts the light emitting structure vertically overlaps the electrode.

19. The light emitting device of claim 12, wherein the first reflective layer ohmic-contacts the light emitting structure.

20. A light emitting device package comprising:
a package body;
first and second electrodes on the package body; and
a light emitting device on the package body, the light emitting device being electrically connected to the first and second electrodes,
wherein the light emitting device comprises:
a conductive support substrate;
a first reflective layer on the conductive support substrate;
a second reflective layer in which at least a portion thereof is disposed on a side surface of the first reflective layer;
a light emitting structure comprising a first conductive type semiconductor layer, a second conductive type semiconductor layer, and an active layer between the first conductive type semiconductor layer and the second conductive type semiconductor layer on the first and the second reflective layers; and
an electrode on the light emitting structure, wherein the second reflective layer schottky-contacts the light emitting structure, wherein a portion of the second reflective layer is disposed between the first reflective layer and the conductive support substrate.

* * * * *